Sept. 28, 1965 B. T. MURPHY ETAL 3,209,214

MONOLITHIC UNIVERSAL LOGIC ELEMENT

Filed Sept. 25, 1961 2 Sheets-Sheet 1

WITNESSES
Edwin E. Bassler
Gordon H. Telfer

INVENTORS
Bernard T. Murphy &
John E. Price
BY
Frederick Shapoe
ATTORNEY

MONOLITHIC UNIVERSAL LOGIC ELEMENT

Filed Sept. 25, 1961

2 Sheets-Sheet 2

United States Patent Office 3,209,214

Patented Sept. 28, 1965

3,209,214

MONOLITHIC UNIVERSAL LOGIC ELEMENT

Bernard T. Murphy, Greensburg, Pa., and John E. Price, Mountain View, Calif., assignors to Westinghouse Electric Corporation, East Pittsburgh, Pa., a corporation of Pennsylvania Filed Sept. 25, 1961, Ser. No. 140,472
3 Claims. (Cl. 317—234)

This invention relates generally to devices and systems for the performance of logic functions and, more particularly, to a monolithic semiconductor device capable of providing all the logic functions of a universal logic element in a single body of material.

It is well known that in computer technology a constant need is to provide very large numbers of electronic components which perform logic functions in a small volume. The present invention is directed to making such a high density of logical elements possible by providing a structure and means for fabrication of a universal logical element within a monolithic semiconductor body.

One of the well known universal logical elements is the "Stroke" gate which performs the function of an AND gate followed by an inverter so that when, and only when, all of the inputs to the device are on, the output is switched off. Since all the logic functions required in the digital computer can be performed using combinations of Stroke gates, it is a universal logic element.

Conventionally, each Stroke element comprises individually interconnected electronic components, namely, transistors, diodes and resistors requiring a large number of interconnections thus reducing reliability and taking up an undesirably large volume.

In accordance with application Serial No. 140,473 by W. M. Kaufmann, filed of even date, and assigned to the assignee of the present invention, now Patent 3,136,-897, issued June 9, 1964, there is shown the feasibility of the fabrication of an entire Stroke gate in a monolithic semiconductor device insofar as the active elements, i.e., transistors and diodes are concerned. However useful the previously disclosed structures are, it is still the case that additional elements external to the semiconductor were necessary and a bulky and not too easily fabricated device resulted.

It is, therefore, an object of the present invention to provide a monolithic universal logic element.

Another object is to provide a Stroke gate within a unitary body of semiconductor material which may be readily fabricated and placed with other such devices in a high density array.

Another object is to provide improved semiconductor geometries which make it possible readily to fabricate a Stroke element within a single body of semiconductor material.

In accordance with the present invention there is provided a monolithic semiconductor device suitable for use as a universal logic element and comprising a unitary body of semiconductor material having a continuous layer of bulk material of a first type semiconductivity with a plurality of oppositely doped regions thereon. The doped regions form a plurality of diode junctions and base-collector junctions of transistors with the bulk material. Additional doped regions on the transistor bases provide the emitter and emitter base junction and input diode action. Also, in the body are provided resistive paths having suitable geometry so that their resistance is such that they can be used as biasing resistors upon application of suitable bias potentials thereto.

Certain features of the invention are generally applicable to monolithic semiconductor devices and not merely to logic elements. They include the manner of providing diode action by using a transistor structure with collector shorted to base. Also, the manner in which two or more serially connected diodes are formed and a transistor structure with a plurality of parallelly disposed diodes at the output result from novel geometries designed for convenience in fabrication.

The features of the present invention which are believed to be novel are set forth with particularity in the appended claims. The present invention, both as to its organization and fabrication, together with the above mentioned and further objects and advantages thereof, may best be understood by reference to the following description taken in conjunction with the accompanying drawings, in which:

Figure 1:
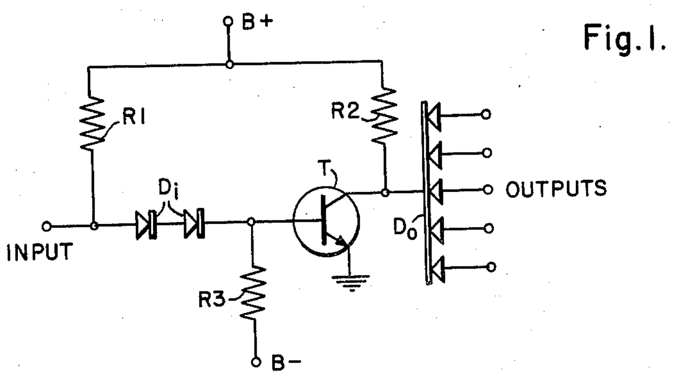
FIGURE 1 is a circuit diagram of a Stroke gate which may be provided by a monolithic device in accordance with the present invention.

Referring to FIG. 1 there is shown a Stroke gate comprising a transistor T having an input applied to its base through input diode rectifiers $D_i$ and a plurality of outputs derived from parallelly disposed output diodes $D_o$. Resistors $R_1$, $R_2$ and $R_3$ are included to suitably bias the collector and base of the transistor T with respect to the emitter which is grounded. The circuit of FIG. 1 is substantially conventional with the exception of a modification made in accordance with the before-mentioned Kaufmann application whereby a multiplicity of signal paths, or ports, are provided on the output side rather than on the input side. It will be noted that this makes little difference to logical designs since the elements are employed in large numbers wherein the bank of diodes appears between individual elements and hence may be attached physically to either the input or the output of the Stroke unit. Due to certain conveniences derived from displacement in fabricating the monolithic device subsequently to be described, this is the preferred form of the invention. Analogous to the conventional Stroke gate, when there is a signal at the input there is no output signal. In application, the outputs of a plurality of elemental circuits like that of FIG. 1 would be connected together and applied to the input of another elemental circuit.

Figure 2:
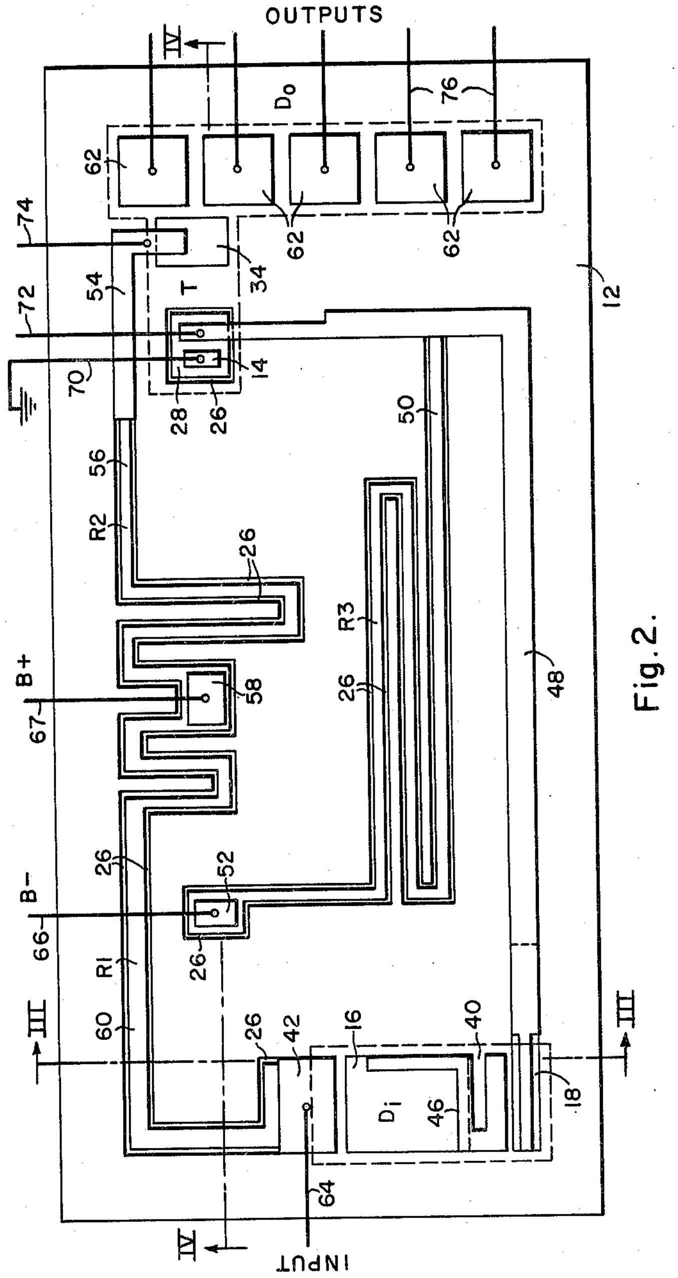
FIG. 2 is a plan view of a monolithic semiconductor universal logic element formed in accordance with the present invention and providing the function of the circuit of FIG. 1.
Figure 4:
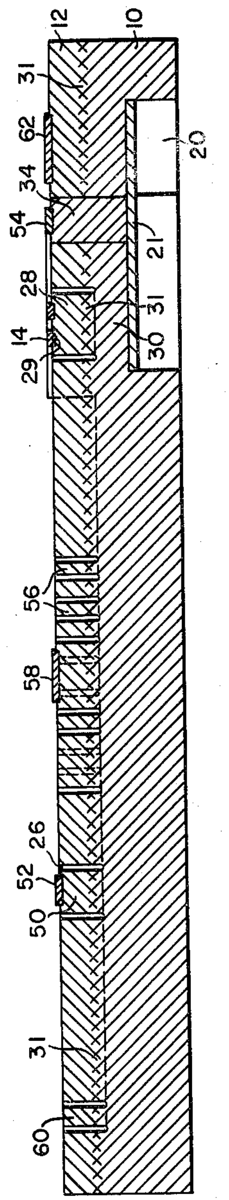
FIG. 4 is a cross-sectional view taken along the line IV—IV of FIG. 2.
Figure 3:
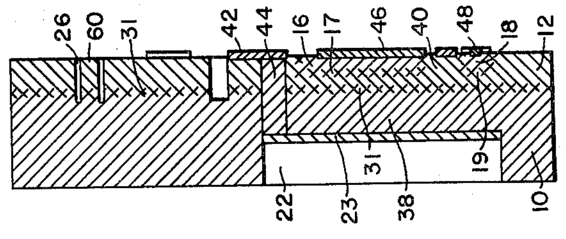
FIG. 3 is a cross-sectional view taken along the line III—III of FIG. 2.

Referring now to FIGS. 2 through 4, there will be described in detail a monolithic Stroke gate which has been fabricated in accordance with this invention. It is to be noted that the essential features of the invention reside in the geometry and topology of the monolithic device shown and may be fabricated by any of a variety of techniques known to those skilled in the art. As a particular example of the present invention there is shown a device formed by well known diffusion and etching techniques resulting in an etched groove type structure. Other types of structures incorporating the invention are referred to hereinafter.

The device comprises generally a high resistivity bulk material 10 of a first type semiconductivity, assumed here for illustration to be n-type, having a layer 12 of p-type semiconductivity on one major surface forming a p-n junction 31 therewith with certain n-type regions 14, 16 and 18 formed thereon. On certain portions of the opposite major surface recesses 20 and 22 are provided in the bulk material 10 in order to reduce the thickness of the wafer. On the surface of the bulk material within the recesses 20 and 22 there are provided layers 21 and 23 of low resistivity n-type material making ohmic contact with the bulk material 10. Grooves 26 extending through the junction 31 divide the p-type layer 12 into appropriately isolated portions.

The function of the transistor T of FIG. 1 is provided by the three region structure including an n-type emitter 14, a p-type base 28 which is separated from the remainder of the p-type layer 12 by a groove 26 and which forms a p-n junction 29 with the emitter 14, and an undivided portion 30 of the bulk material 10 forming a collector p-n junction 31 with the base region 28. The low resistivity n-type layer 21 disposed in the cavity 20 reduces the saturation resistance and forms substantially an equipotential surface for the collector. A conductive path 34 is provided extending from the n-type layer 21 through the wafer to a contact 54 in ohmic contact with the upper surface.

The function of the input diodes $D_1$ is provided by a pair of three region structures each having an undivided portion 38 of the bulk material 10 in common with the low resistivity n-type layer 23 thereon. Also a portion 40 of the p-type layer 12 extends through the two three layer structures; the portion 40 need not be separated from the remainder of the layer 12 by grooves at the immediate periphery of the input diode area because the other grooves 26 provided in other areas give the necessary isolation. The three region structures are completed by the n-type regions 16 and 18 forming junctions 17 and 19 with the portion 40. An input ohmic contact 42 is on the upper surface at one extremity of the portion 40 and a conductive path 44 extends from the contact to the n-type layer 23 on the reverse side.

Figure 5:
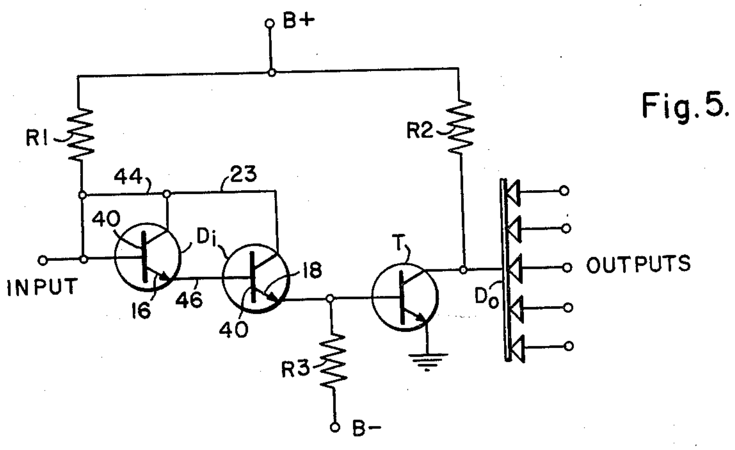
FIG. 5 is an alternate equivalent circuit of the device of FIGS. 2 through 4, which is presented for explanatory purposes.

The two three layer structures are essentially like a pair of transistors with two common regions. However, the conductive path 44 shorts out the "collectors" (portion 38 of bulk material) and the "base" (part of portion 40 of the p-type layer 12) of one of the "transistors." Furthermore, a conductive contact 46 extends across one edge of the junction 17 to part of the portion 40 remote from the input contact 42 thus placing the "emitter" (n-type region 16) of the first "transistor" in contact with the "base" of the second transistor. Therefore, the equivalent circuit of the input diodes may be modified as shown in FIG. 5 with reference numerals indicating analogous portions of the device structure.

Since the thickness of p-type layer 40 between the junctions 17–19 and 31 is usually quite small and hence provides a high resistance path, it is not necessary to physically separate the portion 40 into two separate parts. However, it would be desirable to do so for complete isolation.

A conductive path 48 is provided from the n-type portion 18 of the second input diode to the base 28 of the transistor. A resistive path 50 extends through the p-type surface layer from the conductive strip 48 to a contact 52 for the application of bias potential thereto. The resistive path 50 corresponds to the resistor $R_3$ of FIG. 1.

In the transistor area it has been noted that a conductive path 34 is provided through the wafer so that connection to the collector region 21 may be made on the upper surface. A collector contact 54 is provided with a second resistive path 56 extending therefrom through the p-type layer and corresponding to the resistor $R_2$ of FIG. 1 to a second point 58 of the application for bias potential. From that point 58 of bias application another resistive path 60 extends to the input contact 42. Each of the resistive paths 50, 56 and 60 may be formed by etching or otherwise separating a suitable portion of the p-type surface layer 12. The tortuous paths formed in the device shown are merely representative of what may be done to secure particular resistance magnitudes.

The output diodes have a layer 21 in the recess on the under side of the bulk material 10 in common with that in the transistor collector region. The layer 21 is of low resistivity and hence provides substantially an equipotential surface. Contacts 62 are provided on the upper surface for the number of outputs desired. The continuous junction 31 serves as each output diode junction, it not being necessary to physically divide it for effective operation.

It will readily be seen that the device in FIGURES 2 through 4 combines within a unitary body of semiconductor material the functional equivalent of all the elements shown in the circuit of FIG. 1. The operation and use of the monolithic device is the same as the circuit with a lead 64 being applied to the input contact 42, a first and a second power lead 66 and 67 on ohmic contacts at the bias points 52 and 58, a ground lead 70 in the transistor emitter 14, a base lead 72 suitable for use as an alternate input on the base 28 of the transistor, a collector lead 74 suitable for use as an alternate output on the collector and leads 76 on each of the output diodes. As is preferable, all leads appear on one surface of the device.

It will be noted that the p-type contacts (the portions of layer 12 under the contacts 62) on the output diodes can be effectively isolated by this structure while it would not be as easy to isolate n-type contacts of diodes at the input side. Therefore, the multiple outputs structure as taught in the before-mentioned copending application is preferred over one having multiple inputs.

Since the resistive regions are formed in the p-type layer 12 a problem arises because at the point 58 of application of the B+ the junction between the p-type layer 12 and the n-type material 10 has a forward bias on it. Therefore some interaction between the B+ contact 58 and both the collector 21 of the transistor and the input diodes results through the n-type bulk material. However, this problem is not severe inasmuch as very high resistivity n-type silicon is employed as the bulk material 10 and the spacing between the B+ contact 58 and the collector 21 and input diode 23 areas may be enlarged if necessary.

It should be noted that regarding the location of the transistor structure and the output diode structures, the spacing between the output diode junctions and the emitter junction of the transistor must be substantial, that is, greater than the diffusion length of carriers in the bulk material, otherwise minority carriers injected into the bulk material 10 by the forward biased output diodes can drift or be swept to the collector of the transistor (layer 21 in the transistor area) and cause switching in a manner similar to that which occurs in four layer, three terminal devices such as the Trinistor controlled rectifier. In high speed units, it is necessary to reduce the lifetime of the silicon so that storage does not occur for a long time in the bulk. Of course, lower lifetime material will also allow closer spacing between the output diodes and transistor.

In the fabrication of the device as shown there is first obtained a wafer prepared by methods known to those skilled in the art, for example, a single crystal silicon rod may be pulled from a melt composed of silicon and at least one element from group V of the Periodic Table such as arsenic, antimony or phosphorus where an n-type bulk material is desired. For the desired high resistivity of about 200 ohm-centimeter the impurity level is adjusted to roughly $3 \times 10^{13}$ atoms per cubic centimeter. The material is also produced with a carrier lifetime of greater than about 10 microseconds. The wafer is then cut from the rod in any suitable manner such as by use of a diamond saw. The cut surface of the wafer may then be lapped or etched or both in order to produce a smooth surface after sawing. Alternatively, the semiconductor device of this invention may be prepared from a section of dendritic crystal prepared in accordance with copending application Serial No. 844,288, filed October 5, 1959, now Patent 3,031,403, and assigned to the same assignee as the present invention.

It will of course, be understood that the material of the original wafer is that which makes up the bulk material 10 of the device shown in the drawing with the other regions being produce by subsequent processing operations upon the original wafer.

The size of the wafer from which fabrication starts depends upon what dimensions are necessary to obtain the degree of isolation between regions of the device and the necessary mechanical strength. As an example, for the device shown made in a wafer of material having the previously mentioned resistivity and carrier lifetime the block has dimensions of about 250 mils by 150 mils by 4 mils. Smaller devices are possible.

While it has been stated that the starting wafer may be of silicon, it is to be understood that other semiconductor materials may also be used such as germanium or compounds comprised of stoichiometric proportions of elements of group III and group V of the Periodic Table, for example, gallium arsenide, gallium antimonide, gallium phosphide, indium arsenide and indium antimonide. It will also be understood that the device may be fabricated so that the semiconductivity of the various regions is the reverse of that shown and described.

It is to be expressly understood that the device shown in the drawing may be fabricated by a number of processes involving either alloying techniques, diffusion techniques or both with other processes being possible. As a specific embodiment of the invention and merely by way of example, there is herein given as a method of fabricating the semiconductor device a process which employs only diffusion operations to form the various doped semiconductive region.

It will also be noted that the method described results in a device having etched grooves 26 separating portions of the p-type layer 12. Of course, modifications of the method of fabrication will result in somewhat different structures such as that known as the mesa structure wherein all of the p-type layer 12 which is not a part of a functional region is etched away and the planar structure wherein the p-type layer 12 is selectively diffused only where desired. The latter structures may be somewhat preferable to that shown to avoid spurous currents.

Figure 6:
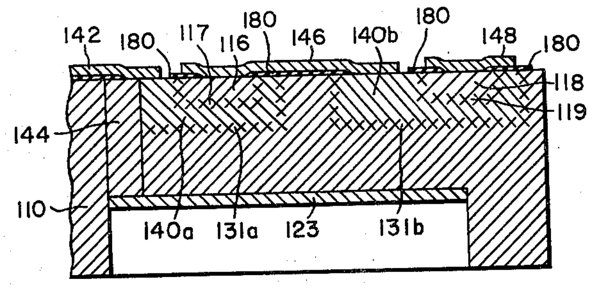
FIG. 6 is a partial cross-sectional view of a device functionally like that of FIGS. 2–4 but made in a planar construction, the position of view is like that of FIG. 3.

Referring to FIG. 6, there is shown a partial cross-sectional view of a device functionally like that of FIGS. 2–4 but with a planar structure. The reference numerals of FIG. 6 correspond to those of FIG. 3 but are greater by 100. Separate p-type regions **140*a* and 140*b* are formed by selective diffusion through a mask, forming junctions 131*a* and 131*b***. Similarly in other regions of the device, individual p-type regions may be formed by diffusion through a mask where necessary for $R_1$, $R_2$, $R_3$, the transistor base and the output diodes. Because of the selective diffusion no etching of the p-type layer is necessary.

FIG. 6 also indicates how metallic contacts extending across the device are preferably formed. An oxide coating 180 protects the exposed junctions to prevent damage to the junction characteristics due to the metallic material.

In forming the device by any technique, the design considerations for the transistor and input and output diodes regarding dimensions, base thickness and doping levels are similar to those in fabricating individual components. It is the combination of such components within a unitary body which presents difficult design problems as to isolation between elements and designing a device which may be readily fabricated.

In making the structure shown in FIGS. 2–4, the initial wafer is first cleaned and oxidized. Then a suitable p-type impurity such as gallium is diffused into the wafer over its entire surface by disposing the wafer in a diffusion furnace which has its hottest zone at a temperature of about 1100° C. to 1250° C. and has an atmosphere containing gallium. The zone of the furnace within which a crucible containing the gallium lies is at a suitable lower temperature being chosen to ensure the desired vapor pressure of gallium from the crucible. Diffusion is continued for a time calculated to be sufficient to provide a layer 12 having a surface concentration of about $10^{18}$ atoms per cubic centimeter in a layer of about 0.0002 inch thick.

The diffused layer 12 is then removed from all but the top surface of the wafer by abrasion or lapping. On the major surface from which the p-type layer has been removed, a layer of masking material such as a wax or a photoresistive material is deposited. Apiezon wax is suitable for such a masking material or a suitable photoresist material is that sold under the tradename KPR by the Eastman Kodak Company. Using well known techniques the masking material is removed in a pattern coinciding with the desired location of the recess 22 in the input diode area and the recess 20 in the transistor and output diode areas. Using an etching solution of a mixture of hydrofluoric, nitric and acetic acids, etching is carried out through the wafer to a desired depth depending upon the desired characteristics of the resulting device, a typical thickness of the remaining wafer being about 1.5 mils.

By use of a masking material, openings are formed in the oxide layer on the bottom surface of the block within the recesses 20 and 22 and at the portion of the top surface where location of the n-type emitter region 14 and the n-type regions 16 and 18 in the input diode area are desired. In a similar manner as in which the gallium diffusion is carried out, diffusion of a suitable donor type impurity such as phosphorus is then performed into those exposed regions until the surface concentration of about $10^{21}$ atoms per cubic centimeter into a depth of about 0.00015 mils is achieved.

In the foregoing diffusion operations, it is preferable that during each diffusion water vapor be available in the diffusant so that an oxide layer is simultaneously produced with a diffusion of the impurity into the wafer. Then after the second diffusion operation, the oxide layer is removed in a select pattern by use of etching after a suitable masking material has been employed in those areas where metallic contacts are to be made. These areas include those necessary for the input contact 42, the metallic contact interconnecting the input diodes 46, the contact 48 interconnecting the last input diode with the transistor base 28, the transistor emitter contact (on n-type region 14), the two bias contacts 52 and 58, the conductive contact 54 from the collector 34 to the second resistive region 56, and each of the output diode contacts 62. Then after removal of the oxide layer, an evaporated metal is deposited in these regions, a suitable metal being aluminum, gold or silver. It should be noted that in removing the oxide layer for performing the metallizing operation, it is essential that no oxide covering a diffusion region edge should be disturbed because it is desirable that the oxide layer remain for protection from shorting by the metallizing layer or from exposure to the atmosphere.

The etched grooves 26 occurring on the upper surface and separating the transistor base and the resistive regions from the remainder of the p-type layer 12 are accomplished by etching through a suitably disposed mask.

Small diameter lead wires 64, 66, 67, 70, 72, 74 and 76 having a diameter of about two mils are bonded to the metallized regions above-mentioned to form external connections to the block.

In order to provide the low resistance paths 34 and 44 through the block from the transistor collector to the upper surface and in the input diode area, there may be employed the method involving a capacitor discharge between metallized surfaces on opposite sides of the block producing breakdown in the semiconductor material and making it substantially conductive. This technique is described in copending application Serial No. 38,051, filed June 22, 1960, by J. P. Stelmak and assigned to the same assignee as the present invention. However, another technique is available whereby the p-type surface layer 12 is etched away in the regions in which the paths 34 and 44 are to be made to remove about 3 to 5 microns of layer 12. During the diffusion operation by which the n-type regions 14, 16 and 18 are formed, the etched portions are exposed and diffusion takes place through to the bulk material 10.

While the present invention has been shown and described in certain forms only, it will be obvious to those skilled in the art that it is not so limited, but is susceptible of various changes and modifications without departing from the spirit and scope thereof.

We claim as our invention:

1. A monolithic universal logic element comprising: a unitary body of semiconductive material having opposing major surfaces and a thickness small compared to the dimensions across said major surfaces; said unitary body having a bulk material of a first type of semiconductivity and a resistivity of at least 100 ohm-centimeters; said bulk material having a plurality of lower resistivity regions thereon to form, in cooperation with said bulk material, the functional equivalent of a stroke gate comprising a pair of serially connected input diodes, a conductive path between said pair of input diodes and the base region of a transistor, a plurality of parallelly connected output diodes each having one side conductively connected with the collector region of said transistor, a first resistive path between the input to said pair of input diodes and a first point for the application of bias potential, a second resistive path between said first point and the collector of said transistor, a third resistive path between the base of said transistor and a second point for the application of bias potential; said pair of input diodes comprising a pair of three region structures of alternate semiconductivity type each having said bulk material as one region in common, an input contact making ohmic contact with a region of second type of semiconductivity on a first major surface of said unitary body in a first of said three region structures, a conductive path provided transversely through said unitary body and in contact with a layer of first type semiconductivity disposed within a recess in the input diode area in said bulk material thereby shorting the junction in said structure formed between said bulk material and said region of second type semiconductivity, a first diode junction between said region of second type of semiconductivity having said input thereon and a first region of first type semiconductivity disposed thereon, a conductive path provided between said first region of first type semiconductivity and the region of second type semiconductivity in said second three-region structure, a second diode junction between said region of second type semiconductivity in said second three-region structure and a second region of first type semiconductivity disposed thereon; said transistor comprising a structure of three regions of alternate type semiconductivity, a collector comprising a portion of said bulk material and a low resistivity layer of material forming ohmic contact therewith in a recess in said bulk material, a base comprising a region of second type semiconductivity on said first major surface and forming a p-n junction with said collector, an emitter comprising a region of first type semiconductivity disposed on said base region, a conductive path provided transversely through said unitary body from said low resistivity layer of said collector to said first major surface; said output diodes comprising in common a portion of said bulk material and a low resistivity layer of material forming ohmic contact therewith in a recess in said bulk material and forming an equipotential surface with said low resistivity layer in said collector region, a layer of second type semiconductivity material disposed on and forming a junction with the recessed portion of said bulk material, a plurality of separate ohmic contacts on said layer of second type semiconductivity, said first, second and third resistive paths provided by physically separated material of said second type semiconductivity disposed on said bulk material and having a size and resistivity sufficient to provide the necessary bias resistances in the stroke gate, ohmic contacts on said material at said first and second points for the application of bias potential; conductive leads affixed to the input contact on said input diodes to provide for reception of an input signal to said stroke gate, to the base of said transistor for the reception of an alternate input signal to said stroke gate, to the emitter of said transistor for connection to a fixed reference potential, to said ohmic contacts on said first and second points for the application of bias potential, to each of said ohmic contacts on said output diodes to derive an output signal therefrom and to said collector of said transistor for deriving an alternate output signal therefrom.

2. In a monolithic semiconductor device, a first portion providing the electronic function of a plurality of serially connected diodes and a second portion providing the function of a junction transistor, said first portion comprising: first and second structures each of three regions of alternate type semiconductivity including emitter, base, and collector regions, said collector region being common to both structures; first conductive means to short out the junction between said collector and said base of said first structure; second conductive means connecting said emitter of said first structure with said base of said second structure; first contact means for supplying an input to said base of said first structure and second contact means for deriving an output from said emitter of said second structure; said second portion comprising three regions of alternate type semiconductivity including emitter, base and collector regions; means to electrically couple said second contact means to said base region.

3. A monolithic semiconductor device suitable for use as a universal logic element of the stroke type comprising: a unitary body of semiconductive material haivng a continuous layer of a high resistivity bulk material of a first type semiconductivity and a plurality of cooperatively disposed doped regions of a second type semiconductivity on said bulk material and of said first type semiconductivity on regions of said second type to form an input region, a transistor region and an output region; said input region comprising at least one diode including a first of said regions of first semiconductivity type and a first of said regions of second semiconductivity type; said transistor region comprising a second of said regions of second type semiconductivity forming a base-collector junction with said bulk material, a second of said regions of first type semiconductivity forming a base-emitter junction with said second region of second type semiconductivity and a layer of material of said first semiconductivity type forming a low resistance ohmic contact on the opposite surface of said bulk material from said base-collector junction; said output region comprising a plurality of diodes each having said bulk material as a common region, a third of said regions of second type semiconductivity disposed over said bulk material and forming a diode junction therewith and a portion of said layer of material of said first type semiconductivity disposed on the opposite surface of said bulk material from said diode junction; a conductive path from the input diode to the transistor base and electrical connection being made between the transistor and the output diodes through said layer of material on said bulk material.

References Cited by the Examiner

UNITED STATES PATENTS

| | | | |
|---|---|---|---|
| 2,663,806 | 12/53 | Darlington | 307—88.5 |
| 2,816,228 | 12/57 | Johnson | 307—88.5/21.3 |
| 2,985,804 | 5/61 | Buie | 317—234 |
| 3,038,085 | 6/62 | Wallmark et al. | 317—235 |
| 3,040,188 | 6/62 | Gaertner et al. | 317—234 |
| 3,134,912 | 5/64 | Evans | 317—234 X |

DAVID J. GALVIN, *Primary Examiner.*

GEORGE N. WESTBY, *Examiner.*